United States Patent [19]

Schnell

[11] Patent Number: 4,533,849
[45] Date of Patent: Aug. 6, 1985

[54] CERAMIC BISTABLE DEFLECTION ELEMENT

[75] Inventor: Axel Schnell, Aachen, Fed. Rep. of Germany

[73] Assignee: U.S. Philips Corporation, New York, N.Y.

[21] Appl. No.: 544,754

[22] Filed: Oct. 24, 1983

[30] Foreign Application Priority Data

Nov. 5, 1982 [DE] Fed. Rep. of Germany ....... 3240884

[51] Int. Cl.³ .......................................... H01L 41/08
[52] U.S. Cl. .................................. 310/330; 310/331; 310/358; 310/359
[58] Field of Search ............................... 310/330–332, 310/358, 359; 200/181

[56] References Cited

U.S. PATENT DOCUMENTS

| 2,782,397 | 2/1957 | Young | 310/358 X |
| 3,646,413 | 2/1972 | Oomen | 310/331 X |
| 3,950,659 | 4/1976 | Dixon et al. | 310/359 |
| 4,349,762 | 9/1982 | Kitamura et al. | 310/331 X |

FOREIGN PATENT DOCUMENTS 2811783  9/1979  Fed. Rep. of Germany ...... 310/331

OTHER PUBLICATIONS

Flexure Mode Piezoelectric Transducers, by C. P. Germano, IEEE Transactions on Audio and Electroacoustics, vol. AU-19, No. 1, Mar. 1971, pp. 6–12.

Primary Examiner—Mark O. Budd
Attorney, Agent, or Firm—Joseph P. Abate

[57] ABSTRACT

A bistable ceramic deflection element includes an assembly of two ceramic plates of a ferroelectric ceramic material which can be easily polarized and which has a low coercive field strength, one plate thereof being polarized so that the deflection element is deflected. The other plate is not polarized. The depolarization of the polarized plate can be performed simultaneously with the polarization of the plate non-polarized thus far, because the interchanging of the polarization condition can be simply performed by briefly applying a direct voltage via two extreme electrodes, provided on the plates. The direct voltage causes polarization of the plate not polarized thus far.

4 Claims, 7 Drawing Figures

CERAMIC BISTABLE DEFLECTION ELEMENT

BACKGROUND OF THE INVENTION

The invention relates to a bistable deflection element comprising an assembly of two plates which are provided with electrodes on both their principal surfaces and which are made of ferroelectric, easily polarizable ceramic material having a low coercive field strength. The plates are arranged with their principal surfaces one over the other and, are rigidly interconnected so that the inner electrodes are also electrically accessible.

The invention also relates to a method of manufacturing such a deflection element.

Unilaterally fixed ceramic deflection elements of polarized, ferroelectric ceramic material are normally deflected when a direct voltage is applied thereto, the deflection being approximately proportional to the applied electric voltage. This means that, when the voltage is interrupted, the zero position of the element is substantially reached again.

In many cases, for example, when ceramic deflection elements are to be used for switching purposes, it may be advantageous to maintain the switch positions of the deflection element after the interruption of the electric voltage; that is to say the deflection is maintained without a further electric voltage being required.

German Patent Application No. P 32 12 576.3 proposes a tristable optical switch in the form of a ceramic deflection element which comprises two plates of ferroelectric ceramic material which are uniformly depolarized in the initial position of the switch, i.e. in the "zero" position of the deflection element, while in the switching position each time one plate is polarized. This switch is depolarized via a decaying alternating voltage.

This switch has proven its worth in practice, but has the drawback that the generating of the decaying alternating voltage requires a certain technical effort.

SUMMARY OF THE INVENTION

It is the object of the present invention to provide a ceramic deflection element which can occupy two stable positions without the continuous presence of an electric voltage being necessary, and which is constructed to operate so that no special circuits are required for depolarization.

To achieve this object, the deflection element in accordance with the invention is characterized in that one of the plates is polarized after the connection to the other plate so that the assembly is deflected, electrical connections being provided on the two extreme electrodes via which the assembly of the two plates in series connection can be activated, by a direct voltage whose polarity opposes that of the voltage used for the polarization of the one plate.

In a preferred embodiment in accordance with the invention, the plates are made of a mixed crystal ceramic material on the basis of lead/rare earth metal-zirconate/titanate, notably a composition which within the system lead/rare earth metal-zirconate/titanate is in the vicinity of the morphotropic phase limit on the rhombohedral side.

A method of manufacturing such a ceramic deflection element is characterized in that it comprises the following steps:

(a) providing electrodes on principal surfaces of two non-polarized ceramic plates of a ferroelectric ceramic material which can be easily polarized and which has a low coercive field strength;

(b) arranging the two plates such that their principal surfaces extend one over the other and then rigidly interconnecting the two plates such that the electrodes which become situated in the center of the resultant assembly remain electrically accessible;

(c) providing electrical connections on the two extreme electrodes;

(d) polarizing one of the plates by applying a suitable electric direct voltage via the common electrodes which are situated in the center of the resultant assembly and via one of the extreme electrodes.

An advantage obtained by means of the invention is notably that the deflection element is capable of occupying two stable positions without additional circuits being required for achieving a depolarization of the relevant polarized plate of the deflection element.

The invention is based on the recognition of the fact that the depolarization of the polarized plate can be performed simultaneously with the polarization of the plate not polarized thus far, because the polarization condition of the plates can be simply interchanged by briefly applying, via the two extreme electrodes, a direct voltage which results in polarization of the non-polarized plate. Because of the series connection of the two plates, the shift currents released during this polarization procedure ensure exactly that the other plate is depolarized. This procedure can be repeated an arbitrary number of times.

It is a further advantage of the invention that substantially no power is required to maintain the switch position, because the voltage required for the polarization of the ferroelectric ceramic plates need be applied only briefly, i.e. for less than 1 second, so actually a voltage pulse is concerned. The substantial length variations occurring during the polarization procedure can be used as switching steps for the switching over of a switch. Said length variations are always larger than length variations of elements in which the polarization condition is not changed. After the switching over, the electric voltage may be switched off again, after which the deflection element remains in the deflected position.

An embodiment in accordance with the invention and its operation will be described in detail hereinafter with reference to the accompanying drawing:

DESCRIPTION OF THE PREFERRED EMBODIMENTS

Figure 2:
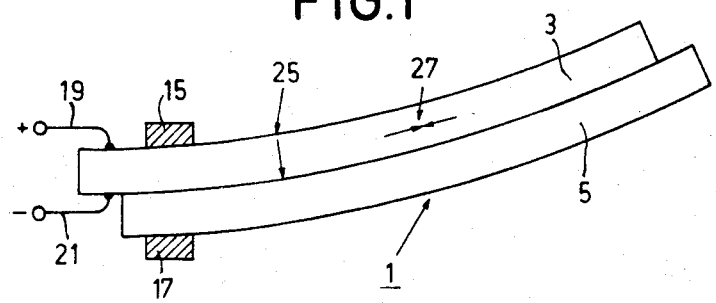
Figure 3:
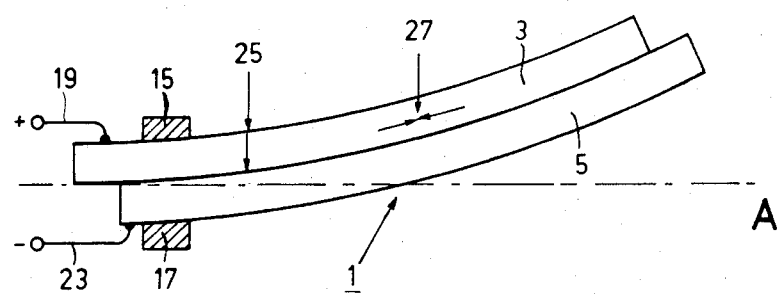
Figure 3:
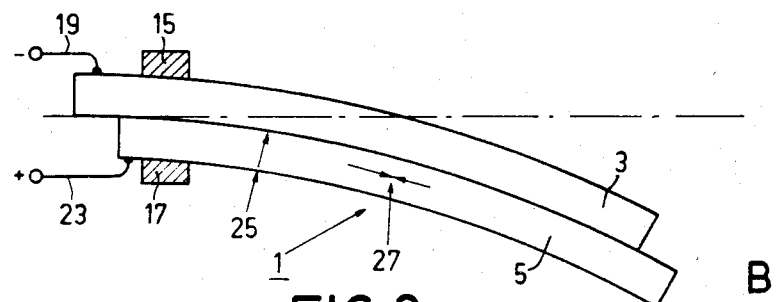

A deflection element 1 in accordance with the invention consists of two plates 3 and 5 which are arranged one over the other. The plates 3 and 5 are rigidly interconnected, for example, by means of an adhesive, and their principal surfaces are provided with electrodes 7, 9, 11 and 13. These electrodes 7, 9, 11 and 13 are only shown in FIG. 1 for the sake of simplicity; however, they are also assumed to be present in the FIGS. 2 and 3. The electrodes 7 and 13 constitute the two extreme electrodes of the deflection element 1 with its plates 3 and 5. At the clamping end (indicated by clamping jaws 15 and 17) the plate 5 is set back with respect to the plate 3, so that the electrodes 9 and 11 are free and electrically accessible. Via each time two of the connections 19 and 21 or 23, a voltage source (not shown) can be connected to the electrodes 7, 9 and 13. In FIGS. 2 and 3, the polarity on the connections as produced by the voltage source (not shown) is denoted as "+" and "−". This polarity causes deflection of the deflection element.

The plates 3 and 5 of the deflection element 1 are made of a ferroelectric ceramic material. This material can be easily polarized and depolarized and is based on lead/rare earth metal-zirconate/titanate, notably a composition in accordance with the formula $Pb_{0.94}La_{0.06}Zr_{0.65}Ti_{0.35}O_3$. The coercive field strength then amounts to 7 kV/cm. The thickness of the plates 3 and 5 amounts to approximately 230 $\mu m$; their length amounts to approximately 17 mm and their width to approximately 7 mm. The electrodes 7, 9, 11 and 13 are preferably formed by vapor-deposited electrode layers.

Figure 1:
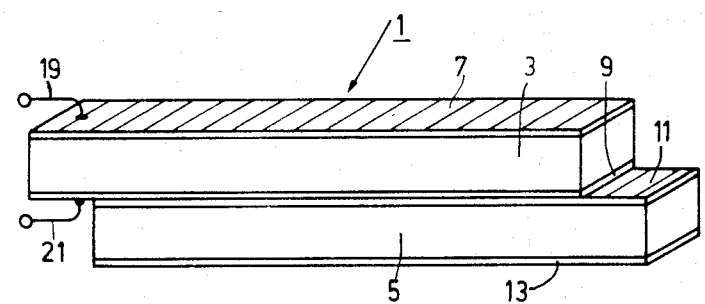
FIGS. 1 to 3 are diagrammatic views which show the principle of a deflection element in accordance with the invention in different positions in accordance with the polarization condition of the ceramic plates.

FIG. 1 shows the neutral position of the assembly of the two plates 3 and 5. In this position, the plates 3 and 5 are both non-polarized so that they have the same length and the assembly extends rectilinearly. After application of a direct voltage pulse to the plate 3 via the connections 19 and 21, the length of the plate 3 is changed by polarization, and the deflection element is deflected; this deflection is also maintained after interruption of the voltage (see FIG. 2). In the FIGS. 2 and 3, the polarization direction is denoted by an arrow 25, the direction of the variation of the length being denoted by the arrows 27. The amplitude of the voltage pulse for the polarization should be chosen so that the field strength produced thereby exceeds the coercive field strength of the material to be polarized. The polarity of the first voltage pulse for the polarization is not important, because always a deformation occurs in the same direction during the polarization procedure. The deflection element thus prepared is now ready for use and occupies one of the two stable positions.

In FIG. 3A this position is represented again. It will be referred to as position A. It is characterized in that one of the two plates 3 and 5 forming the deflection element 1, that is to say the plate 5, is non-polarized, while the other plate 3 is electrically polarized.

The other one of the two stable positions, the position B shown in FIG. 3B, is characterized in that the polarization condition of the plates 3 and 5 has been interchanged, i.e. the initially non-polarized plate 5 is now polarized and the initially polarized plate 3 has been depolarized during the polarization of the plate 5. This interchanging of the polarization condition is simply achieved, without additional structural or circuit-technical steps, in that, via the connections 19 and 23, a direct voltage is briefly applied to the two extreme electrodes 7 and 13, said direct voltage causing polarization of the non-polarized plate. The shift currents released during this polarization procedure cause depolarization of the polarized plate thanks to the fact that the two plates 3 and 5 are connected in series. This procedure can be repeated an arbitrary number of times.

Figure 4:
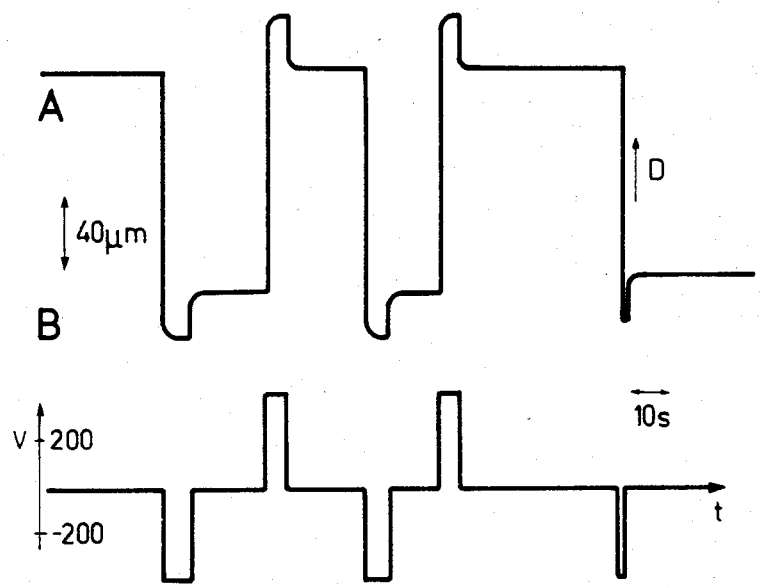
FIG. 4 is a diagrammatic representation of measurements of deflections of a deflection element in accordance with the invention.

FIG. 4 shows measurement results obtained with a deflection element in accordance with the invention. The deflections which can be achieved by means of the present deflection element are larger than with a ceramic deflection element of the same dimensions in which the polarization conditions are not changed.

Figure 5:
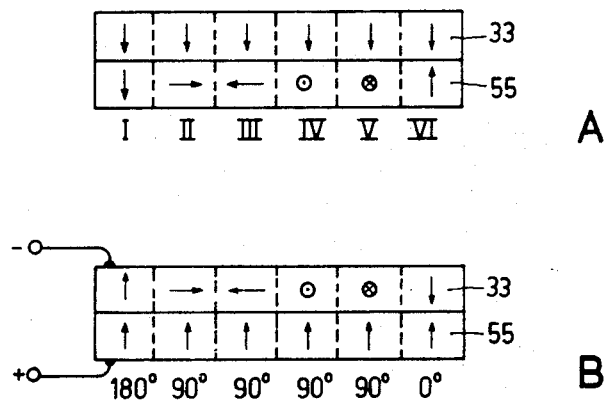
FIGS. 5A and 5B show models of the influencing of the polarization condition of the two ceramic plates of the deflection element in accordance with the invention by the application of a direct voltage to the extreme electrodes.

FIG. 5 shows, in the form of a model, that the interchanging of the polarization condition by a voltage applied to the extreme electrodes only enables polarity reversal of the initially polarized plate to exactly the depolarized condition. FIG. 5A shows that the non-polarized plate 55 is characterized in that the distribution of the polarization directions in the ceramic material between all the six spatial directions (I . . . VI) is uniform. However, a 100% polarized ceramic material exhibits only a single polarization direction (plate 33). During polarization reversal (FIG. 5B), each time only the same amount of polarization can be changed in both plates by the shift current which is equal in both plates due to the series connection of the plates 33 and 55. For the spatial direction I, a rotation of the polarization through 180° is possible in both plates 33, 55. For the spatial directions II to V, however, only a rotation of 90° is possible. The components of the spatial directions VI even block one another, so that no rotation is possible. Consequently, after the polarization reversal a uniform distribution of the polarization directions remains in the upper plate 33 (in FIG. 5B), i.e. the material of this plate is depolarized, while the material of the plate 55 is complete polarized.

For the described operation, the material used for the plates 3 and 5 of the deflection element 1 should have the following properties: the coercive field strength should be as low as possible in order to enable the use of as low as possible voltage pulses for the polarization and depolarization of the ceramic material. Moreover, the difference between the maximum length variation of the ceramic plates due to the applied voltage and the remaining length variation after interruption of the voltage pulse must be as small as possible.

The proposed ceramic deflection element can be advantageously used as a switch in measuring apparatus for optical data transmission. However, it can generally be used as a switching element whenever magnetic fields exert a disturbing effect. For example, it can replace relays which must be provided with a complex magnetic shield in order to neutralize disturbing magnetic influences.

What is claimed is:

1. A bistable deflection assembly, comprising:
   two plates each having an inner principal surface provided with an inner electrode and each also having an outer principal surface provided with an extreme electrode, the plates being arranged such that the inner electrodes are adjacent and electrically contact one another and such that the inner electrodes are electrically accessible, the plates being rigidly interconnected and being formed of a ferroelectric, easily polarizable ceramic material having a low coercive field strength, one plate being polarized by applying a direct voltage at the inner and extreme electrodes of only the one plate after the one plate is rigidly interconnected to the other plate, the other plate being non-polarized, so that the assembly is deflected to a first stable position, and
   two electrical connections provided, respectively, on the two extreme electrodes so that the plates are in a series electrical arrangement, whereby the assembly can be deflected to a second stable position by another direct voltage applied to the electrical connections, the another direct voltage having a polarity opposite that of the direct voltage used for polarizing the one plate, the application of the another direct voltage depolarizing the one plate while polarizing the other plate.

2. A deflection element as claimed in claim 1, characterized in that the plates are made of a mixed crystal ceramic material on the basis of lead/rare earth metal-zirconate/titanate.

3. A deflection element as claimed in claim 2, characterized in that the mixed crystal ceramic material has a composition which within the system lead/rare earth metal-zirconate/titanate is in the vicinity of the morphotropic phase limit on the rhombohedral side.

4. A deflection element as claimed in claim 3, characterized in that the mixed crystal ceramic material has a composition in accordance with the formula $Pb_{0.94}La_{0.06}Zr_{0.65}Ti_{0.35}O_3$.

* * * * *